United States Patent
Hempenius et al.

(10) Patent No.: US 10,809,634 B2
(45) Date of Patent: Oct. 20, 2020

(54) STAGE SYSTEM AND METROLOGY TOOL

(71) Applicant: ASML Netherlands B.V., Veldhoven (NL)

(72) Inventors: Peter Paul Hempenius, Nuenen (NL); Marcel Koenraad Marie Baggen, Nuenen (NL); Thomas Jan De Hoog, Liempde (NL); Sinar Juliana, Eindhoven (NL); Henricus Martinus Johannes Van De Groes, Tiel (NL)

(73) Assignee: ASML Netherlands B.V., Veldhoven (NL)

( * ) Notice: Subject to any disclaimer, the term of this patent is extended or adjusted under 35 U.S.C. 154(b) by 50 days.

(21) Appl. No.: 15/921,124

(22) Filed: Mar. 14, 2018

(65) Prior Publication Data

US 2018/0267410 A1 Sep. 20, 2018

(30) Foreign Application Priority Data

Mar. 17, 2017 (EP) .................................... 17161515

(51) Int. Cl.
*G03B 27/58* (2006.01)
*G03F 7/20* (2006.01)
(Continued)

(52) U.S. Cl.
CPC ............ *G03F 7/7065* (2013.01); *G03F 7/709* (2013.01); *G03F 7/7085* (2013.01);
(Continued)

(58) Field of Classification Search
CPC ............... G01N 21/47; G01N 21/9501; G01N 2021/4735; G01N 2201/02; G03F 7/7065;
(Continued)

(56) References Cited

U.S. PATENT DOCUMENTS 7,042,552 B1    5/2006  Werkman et al.
7,483,120 B2    1/2009  Luttikhuis et al.
(Continued)

FOREIGN PATENT DOCUMENTS

CN    101071276 A    11/2007
EP    1 018 669 A2    7/2000
EP    1 628 164 A2    2/2006

OTHER PUBLICATIONS

International Search Report and Written Opinion of the International Searching Authority directed to related International Patent Application No. PCT/EP2018/054890, dated Jun. 6, 2018; 10 pages.

*Primary Examiner* — Christina A Riddle

(74) *Attorney, Agent, or Firm* — Sterne, Kessler, Goldstein & Fox P.L.L.C.

(57) ABSTRACT

Disclosed is a stage system and metrology apparatus comprising at least one such stage system. The stage system comprises a stage carrier for holding an object and a stage carrier positioning actuator for displacing the stage carrier. The stage system also comprises a balance mass to counteract a displacement of the stage carrier, and a balance mass positioning actuator for displacing the balance mass. A cable arrangement is connected to the stage carrier for the supply of at least power to said stage carrier. The stage system is operable to apply a compensatory feed-forward force to the balance mass which compensates for a cable arrangement force exerted by the cable arrangement.

16 Claims, 6 Drawing Sheets

(51) Int. Cl.
*G01N 21/95* (2006.01)
*G01N 21/47* (2006.01)

(52) U.S. Cl.
CPC ...... *G03F 7/70625* (2013.01); *G03F 7/70633* (2013.01); *G03F 7/70716* (2013.01); *G03F 7/70725* (2013.01); *G03F 7/70766* (2013.01); *G03F 7/70991* (2013.01); *G01N 21/9501* (2013.01); *G01N 2021/4735* (2013.01); *G01N 2201/02* (2013.01)

(58) Field of Classification Search
CPC ............. G03F 7/70625; G03F 7/70633; G03F 7/70716; G03F 7/70725; G03F 7/70758; G03F 7/70766; G03F 7/70775; G03F 7/7085; G03F 7/709; G03F 7/70991
USPC ............... 355/30, 52, 53, 55, 67, 72–77; 250/442.11
See application file for complete search history.

(56) References Cited

U.S. PATENT DOCUMENTS

| | | | |
|---|---|---|---|
| 7,948,609 B2 | 5/2011 | Schneiders et al. | |
| 2002/0079464 A1* | 6/2002 | Driessen | G01N 23/04 250/492.1 |
| 2003/0173556 A1* | 9/2003 | Watson | B23Q 1/58 254/389 |
| 2004/0158427 A1 | 8/2004 | Binnard et al. | |
| 2005/0231706 A1* | 10/2005 | Yang | G03F 7/70725 355/72 |
| 2006/0077364 A1* | 4/2006 | Cox | G03F 7/70725 355/53 |
| 2006/0241873 A1* | 10/2006 | Hsin | G03F 7/70725 702/41 |
| 2007/0279742 A1 | 12/2007 | Plug et al. | |
| 2009/0296081 A1 | 12/2009 | Plug et al. | |
| 2009/0316129 A1* | 12/2009 | Butler | G03B 27/54 355/67 |
| 2010/0020525 A1* | 1/2010 | Butler | G03F 7/709 361/826 |
| 2012/0019801 A1 | 1/2012 | Simons et al. | |

\* cited by examiner

STAGE SYSTEM AND METROLOGY TOOL

FIELD

The present invention relates to a stage system and metrology tool for measuring a parameter of a substrate which substrate has been provided with a pattern in a lithographic apparatus, the parameter, for example, being an Overlay (Ovl) and/or Critical Dimensions (CD) and/or Film Thickness (FT) and/or Refractive Index (RI) of a layer and/or macro defects and/or micro defects.

BACKGROUND

A track is a machine that applies one or more photosensitive films onto a substrate (zero or more films may be anti-reflective coatings to improve imaging performance of the lithographic apparatus). The thickness and refractive index of each film may be critical and must therefore be controlled e.g. using FT and/or RI measurements.

This coated substrate can be measured using the metrology tool, data is processed and can be used for feedback or feed forward control of upstream and downstream process steps.

The coated substrate is now transported to the lithographic apparatus for exposure.

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the lithographic apparatus it is critical to accurately set the position of the substrate, in order to position different layers correctly on top of each other. This process is known as aligning. Accurate aligning is generally done by accurately determining the position of the substrate relative to a substrate table and determining the position of the substrate table with respect to the patterning device and projection beam. With this it is possible to use different alignment strategies. Choosing the optimal alignment strategy is important in obtaining optimal overlay. Different procedures for selecting an alignment strategy have been developed to comply with different applications. With this use is being made of an overlay indicator. See for further description of possible alignment strategies for instance U.S. Pat. No. 7,042,552, which is incorporated herein by reference.

Besides overlay the shape "Critical Dimensions" of the exposed structures (like lines and/or contact holes) is an important parameter to control.

After exposure the substrate is developed, the exposed or unexposed resist is removed (depending on positive or negative resist). The shape of the formed resist structures must be correct, in terms of OVL, CD, macro defects, micro defects, etc. This is checked using a metrology tool after the develop process.

The values of the overlay indicators can, for example, be calculated by measuring single batches of substrates on an overlay metrology tool. For this an offline overlay metrology tool is used in order to get high confidence values. Measuring of the substrates on the offline overlay metrology tool causes extra effort and time, particularly since the overlay metrology tool is relatively slow, due to low speed stages and because of high settling times.

Competing metrology tools have relatively high acquisition times such that lower move times do not impact throughput greatly. In case of a metrology tool with low acquisition times the movement time becomes the dominant throughput limiter. Fast stages with low (system) settling times become important.

A measurement (Move-Acquire-Measure) may consist of:
move to a measurement site on the substrate—this site has special structures (including no structure at all for FT or structures in multiple process layers) to be sensitive for the effect(s) being investigated (like Ovl, CD, FT, RI, macro defects, micro defects etc.)
acquisition—illuminating the site with light of certain wavelength(s) (and certain bandwidth), certain polarization mode and aperture settings. The reflected light is projected on a sensor.
measurement—the sensor data is processed using certain algorithms to yield information on the effects that must be reported (OVL, CD, FT, RI, macro defects, micro defects).

A metrology tool such a scatterometer typically includes a base frame and a substrate stage constructed to carry a substrate movably connected in the "Y" direction with respect to the base frame, using a first displacement system. Above the substrate stage along the Z direction, there is provided a sensor stage arranged to detect radiation scattered from the substrate, the sensor stage being movably connected in the "X" direction to the base frame by means of a second displacement system. The substrate stage is typically also provided with a third displacement system configured to rotate the substrate table in the X-Y plane with respect to the substrate stage. Each displacement system may be fixed to the surrounding frame. However this may introduce vibrations in the frame, which may limit performance and/or throughput. In order to minimize this, it is known to provide at each stage, that is the substrate stage and the sensor stage, a balance mass designed to avoid acceleration forces from being applied to the frame.

SUMMARY

It is desirable to provide a stage system for which frame vibrations are reduced compared to known stage systems.

According to a first aspect of the present invention, there is provided a stage system, comprising a stage carrier positioning actuator for displacing the stage carrier; a balance mass to compensate the reaction force of said stage carrier; a balance mass positioning actuator for displacing the balance mass; a cable arrangement connected to the stage carrier for the supply of at least power to said stage carrier; wherein the stage system is operable to apply a compensatory feed-forward force to the balance mass which compensates for a cable arrangement force exerted by the cable arrangement.

In a second aspect of the invention, there is provided a metrology tool operable to measure a parameter of a substrate, comprising a frame and one or more stage systems mounted to said frame, wherein at least one of said one or more stage systems comprises: a stage carrier for holding an object; a stage carrier positioning actuator for displacing the stage carrier; a balance mass to compensate the reaction force of said stage carrier; a balance mass positioning actuator for displacing the balance mass; a cable arrangement connected between the stage carrier and the frame for the supply of at least power to said stage carrier; and is operable to apply a compensatory feed-forward force to the balance mass which compensates for a cable arrangement force exerted by the cable arrangement.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
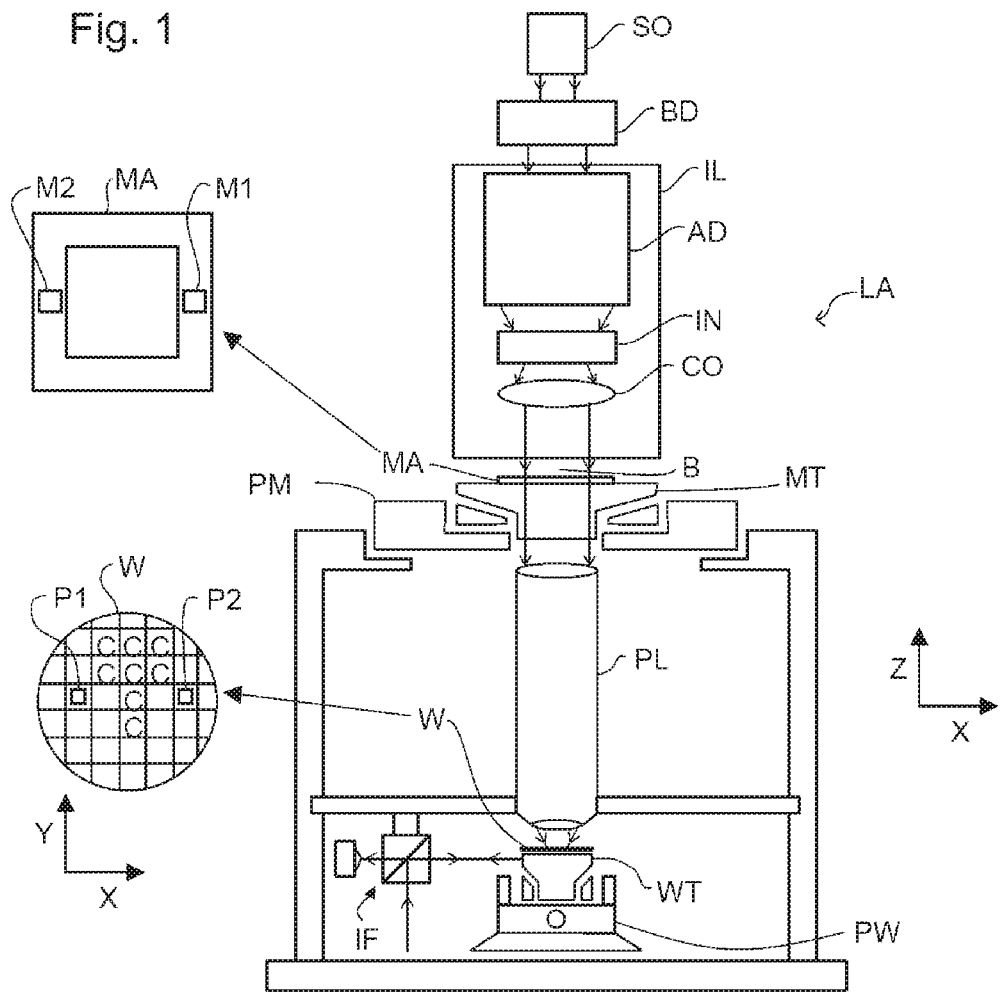
FIG. 1 depicts a lithographic apparatus.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present example environments in which embodiments of the present invention may be implemented.

FIG. 1 schematically depicts a lithographic apparatus. The apparatus comprises: an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
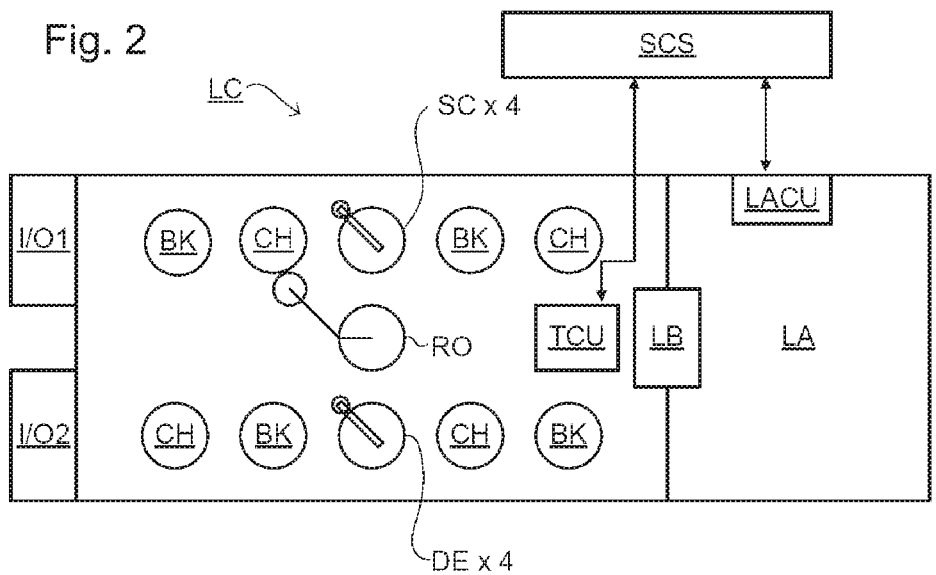
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system Scable slab, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
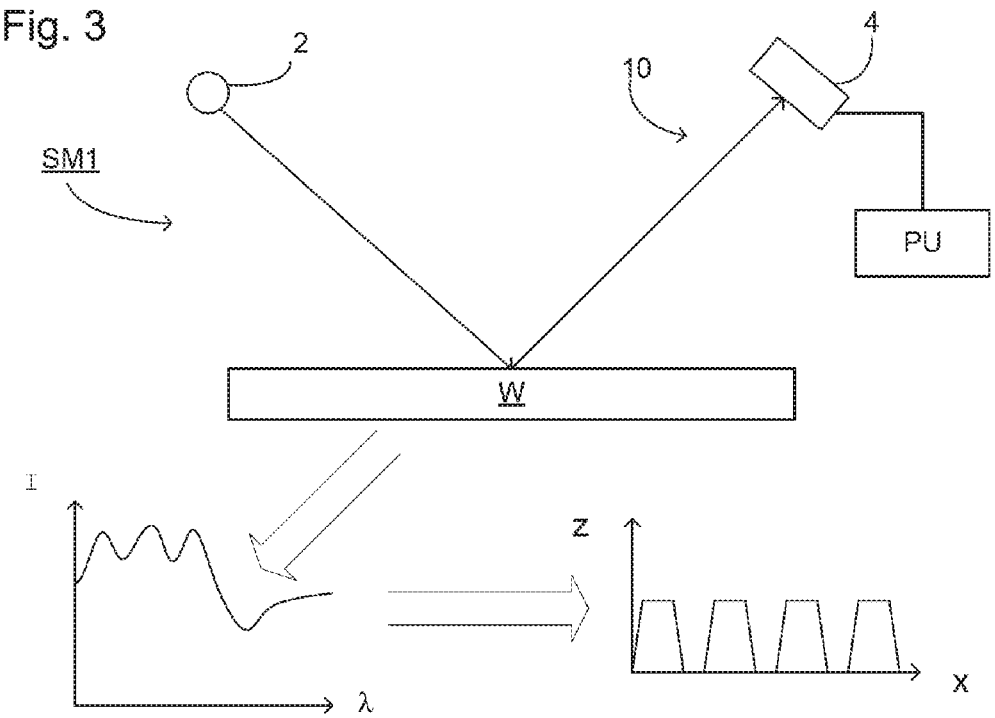
FIG. 3 depicts a first scatterometer.

FIG. 3 depicts a scatterometer which may be used in an embodiment of the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., conventionally by Rigorous Coupled Wave Analysis (RCWA) and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
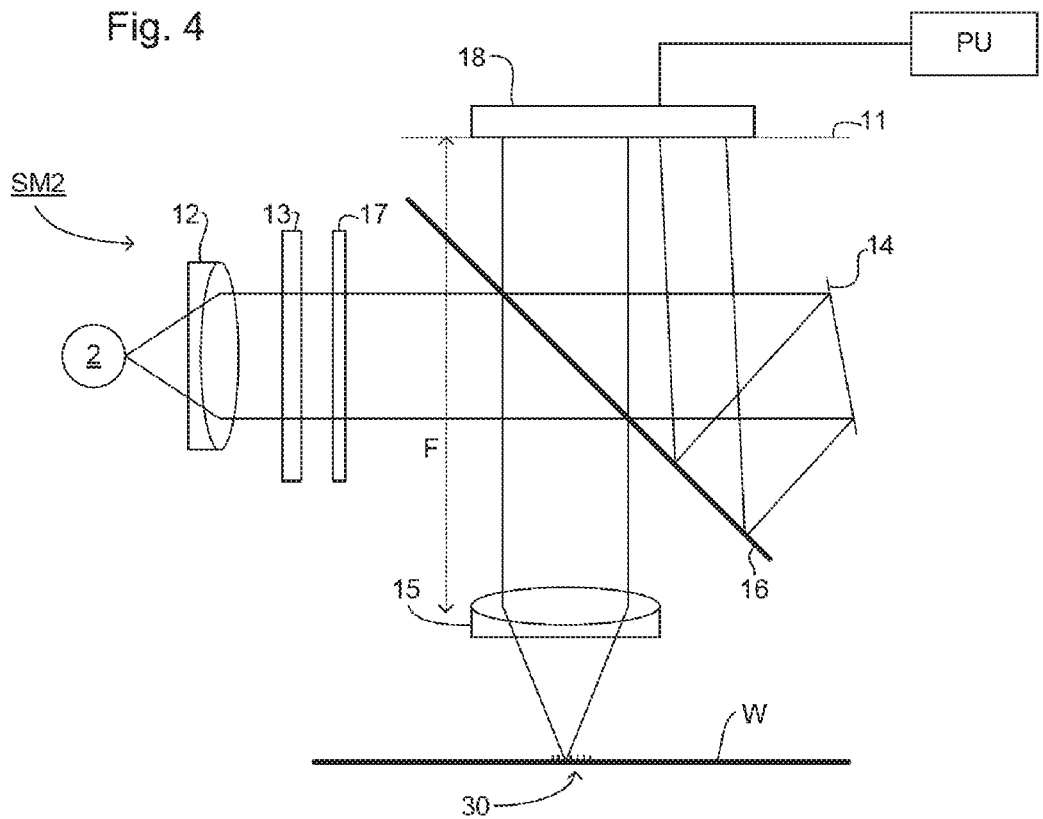
FIG. 4 depicts a second scatterometer.

Another scatterometer that may be used in an embodiment of the present invention is shown in FIG. 4. In this device, the radiation emitted by radiation source 2 is focused using lens system 12 through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$, and a spacing of at least 2 $\Delta\lambda$, (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A.

The target 30 on substrate W may be a grating, which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

Figure 5A:
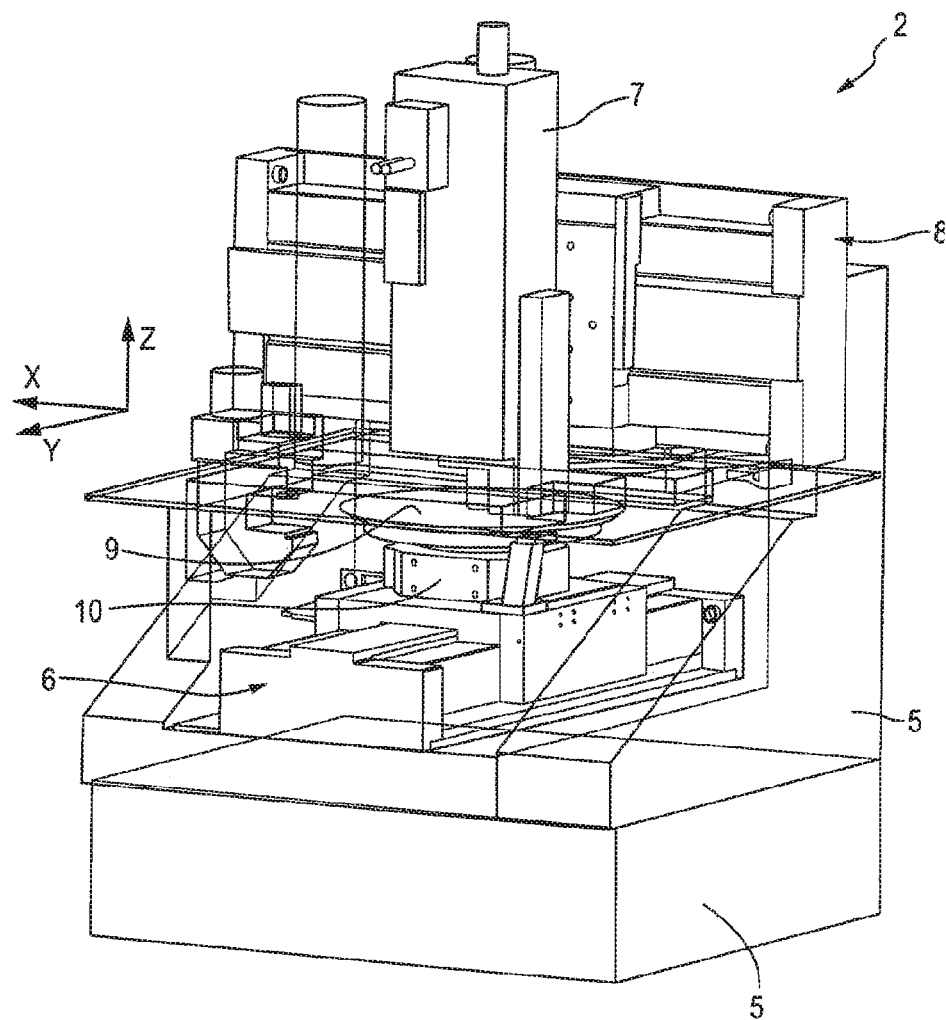
FIG. 5(a) depicts a depicts a metrology tool according to an embodiment of the invention.
Figure 5B:
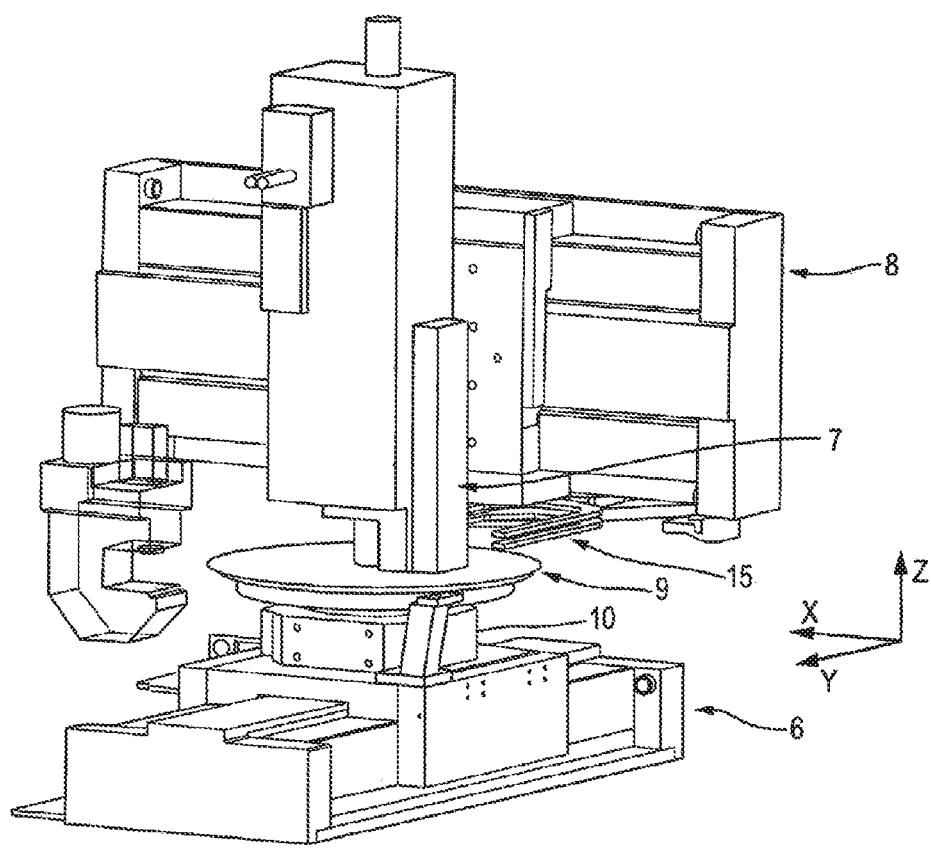
FIG. 5(b) depicts the metrology tool of FIG. 5 a without the base frame.

FIGS. 5(a) and 5(b) shows the main module assembly (MMA) 2 of a metrology tool 2 in more detail, including two stage systems. The main module assembly 2 comprises a base frame 5. With the base frame 5 a substrate stage carrier 6 is movably connected in the Y-direction with respect to the base frame 5 by means of a first positioning actuator. Above the substrate stage carrier 6 a sensor 7 is provided. The sensor 7 forms part of a sensor stage system 8 which is movably connected in the X-direction with respect to the base frame 5 by means of a second stage carrier positioning actuator. The substrate stage carrier 6 is constructed to hold a substrate 9. For this, the substrate stage carrier 6 comprises a substrate table 10. The substrate stage carrier 6 is provided with a third displacement system to rotate the substrate table 10 around the Z-axis with respect to the substrate stage carrier 6.

Thus the substrate 9 and the sensor 7 can be moved with respect to each other in several directions, which makes it possible to measure for example the entire overlay of patterns on the substrate 9 when held on the substrate table 10 of the substrate stage carrier 6.

Furthermore the metrology tool 2 comprises transfer means in the form of a substrate exchanger gripper 15, which can be seen in FIG. 5(b).

In the metrology tool 2, reactions on the base frame 5, acceleration forces used to position the substrate table 10 and sensor 7 to sub-micrometer accuracy, are a major cause of vibrations. These vibrations impair the accuracy of the metrology tool 2. To minimize the effects of the vibrations, according to the state of the art the acceleration forces of the stages 6, 8 and/or table 10 are kept as low as possible, and/or the base frame 5 of the metrology tool 2 is kept isolated from the lithographic apparatus 1. Otherwise the vibrations coming from the metrology tool 2 would impair the accuracy of the lithographic process in the lithographic apparatus 1.

It is known to provide a balance mass system for counteracting displacements of the substrate stage carrier 6 (with substrate table 10 and substrate 9) in the Y-direction and/or for counteracting displacements of the sensor stage carrier 8 with sensor 7 and/or of the substrate table 10 with substrate 9 around the Z-direction. The balance masses enable the substrate stage carrier 6 and/or substrate table 10 with the substrate 9, and the sensor stage carrier 8 with the sensor 7 to move at higher speed with respect to each other. Thus a first balance mass may be constructed and arranged to counteract displacements of the sensor stage carrier 8 with the sensor 7 in the X-direction with respect to the base frame 5. In addition and/or as an alternative a second balance mass may be constructed and arranged to counteract displacements of the substrate stage carrier 6 with the substrate table 10 and the substrate 9 in the Y-direction with respect to the base frame 5. In addition and/or as an alternative a third balance mass may be constructed and arranged to counteract displacements of the substrate table 10 and the substrate 9 around the Z-direction with respect to the substrate stage carrier 6 and base frame 5. In each case, the position of a combined center of gravity of the balance mass and the relevant one of the substrate table and sensor, relative to the base frame remains substantially stationary.

Figure 6:
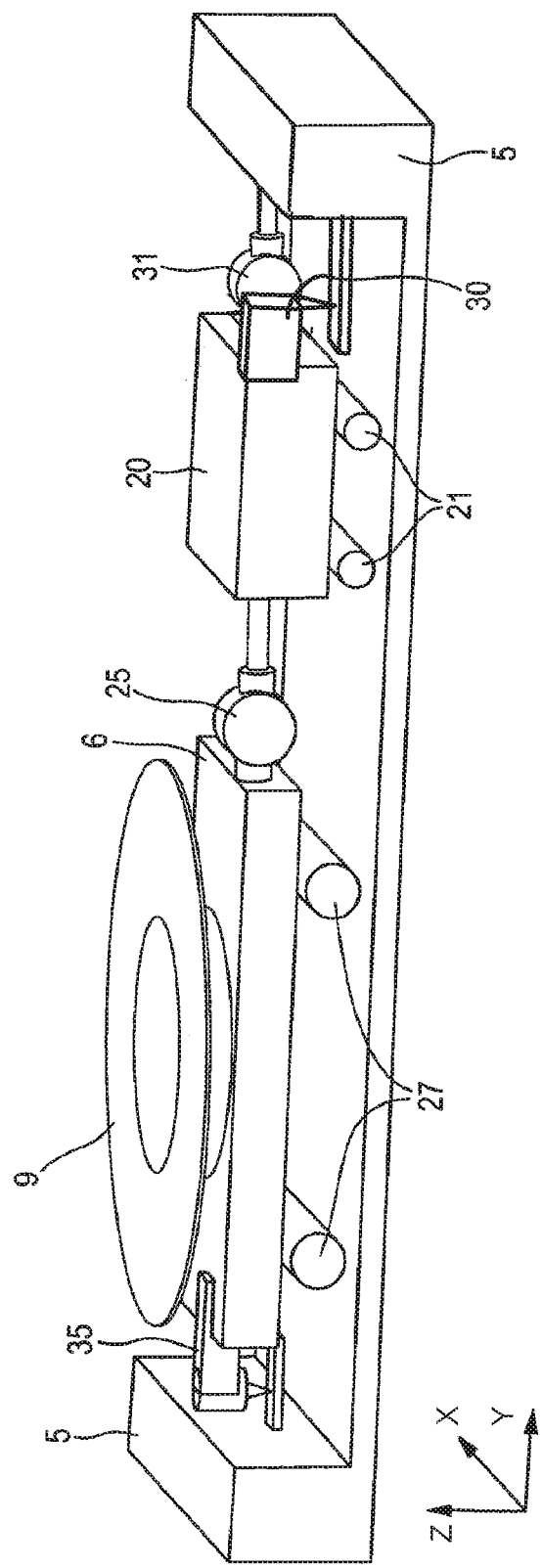
FIG. 6 depicts a part of the metrology tool of FIG. 5 showing an embodiment of a substrate stage system having a balance mass system in line with the substrate table.

In FIG. 6 a balance mass 20 is provided, which is placed on a bearing 21 (for example a roller bearing or gas bearing). The bearing 21 movably supports the balance mass 20 with respect to the base frame 5 so as to be substantially free to translate in a direction which is opposite to a displacement of the substrate stage carrier 6 with substrate table 10 and substrate 9 in the Y-direction. The balance mass 20 is coupled to the substrate stage carrier 6 by means of a substrate stage carrier positioning actuator 25, for example a stepping motor or other steerable drive. The substrate stage carrier 6 is placed on a bearing 27. The bearing 27 movably supports the substrate stage carrier 6 with respect to the balance mass 20 so as to be substantially free to be displaced in the Y-direction by the actuator 25.

One or more feed forward controllers may be provided to measure the position of the substrate table 6 with respect to the balance mass or base frame. Such a feed forward controller 35 is shown between the substrate stage carrier 6 and the balance mass 20. In addition, or alternatively a feed forward controller 30 may be provided between the balance mass 20 and the base frame 5, which measures the position of the balance mass 20 with respect to the base frame 5.

In an embodiment, if substrate table 6 is driven by the actuator 25, and thus displaced in the Y-direction, a reaction force is immediately set on the balance mass 20, causing the balance mass 20 to move in the opposite direction. A balance mass actuator 31, for example a stepping motor or other steerable drive, is provided between the balance mass 20 and base frame 5. The balance mass actuator 31 may correct the position of the balance mass 20 which can have a tendency to drift from a correct position. This drift can be the result of friction between the base frame 5 and the balance mass 20, for example.

The balance mass positioning actuator 31 may additionally operate to directly displace the balance mass 20 to compensate for movement of the substrate stage. Displacement of the substrate stage 6 may be immediately detected by the feed forward controller 35 which sends out a signal to the balance mass positioning actuator 31 in order to displace the balance mass 20 by a corresponding amount in the opposite direction.

The amount of displacement of the balance mass in the opposite direction depends on the mass ratio of the balance mass 20 with respect to the substrate stage carrier 6 (including the substrate table 10, the substrate 9, etc.). The provision of this balance mass system makes it possible to substantially enlarge the speed and acceleration forces of the substrate stage carrier 6. All deviations of the balance mass 20 with respect to the expected position may be corrected by the balance mass actuator 31. The higher speed and higher acceleration forces may no longer lead to vibrations and/or other disturbing forces in the base frame 5 of the metrology tool 2.

Figure 7:
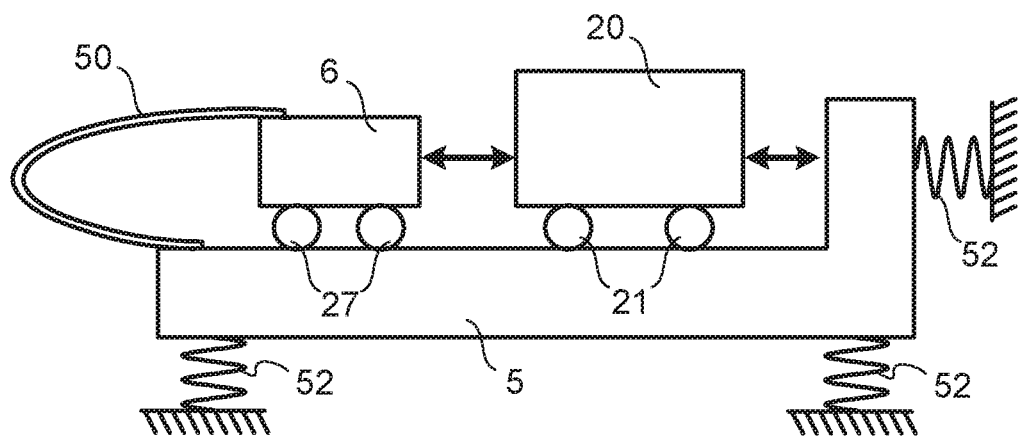
FIG. 7 depicts in a simplified schematic drawing, the substrate stage system of FIG. 5 including cable slab connection and base frame mounting.

FIG. 7 shows a simplified version of FIG. 6, and additionally showing a cable arrangement or cable slab 50 and a vibration isolation support (VIS) system 52. The main module assembly (MMA) is mounted via the VIS system 52 to isolate it from floor and track vibrations. The cable slab 50 provides power and coolant supply to the substrate stage carrier 6, with a static part of cable slab 50 interfacing directly to the base frame 5. A similar arrangement is applicable to the sensor stage carrier. The VIS system 52 may be passive (e.g., comprise springs) or may be active (e.g., comprise air mounts). The first resonance frequency of the MMA on the VIS system 52 is approximately 6 Hz in horizontal direction. This mode (also known as VIS-mode) is easily excited by the moving stages and is a main cause of performance degradation.

The position setpoint of each balance mass of the MMA is derived from the acceleration setpoint of its corresponding stage, taking the mass ratio between stage and balance mass into account (balance mass ratio). Typically, a position controller reacts on a difference between a position set point and an actual position signal with a corrective force. In addition to the position controller force, an acceleration set point feed-forward may be present. The acceleration set point feed-forward signal is generated from a desired acceleration or set point acceleration. The acceleration feed-forward being determined (in its simplest form) by multiplying the desired acceleration with a mass of the stage. The set point acceleration substantially equals a double derivative with respect to time of the set point position. The main goal of the set point acceleration feed-forward is to accelerate the stage such that its position matches the desired position without needing a mismatch between the desired and the actual position to make the position controller react. Hence, the acceleration feed-forward makes it possible for the object to closely follow its set point position without needing an input to the position controller.

During the relatively large moves of each stage, the corresponding cable slab rolls up and off, leading to disturbance forces between MMA and stage in both the axial (drive) direction, and in the perpendicular direction as cable slab mass travels from the static to the dynamic part of the slab and vice versa. In a first order, the disturbance forces in the drive direction on the stage and MMA frame are of equal magnitude, but opposite sign (in fact, internal slab dynamics cause minor deviations from this simple equality).

In a quasi-static examination, the forces that are required to deform and accelerate the cable slab are on one side generated by the stage, balance mass and frame on the other side generated by the mounting interface to the frame. In this way, no net frame acceleration force remains and the frame will not move. In a dynamic examination however, the very low bandwidth of, in particular, the balance mass (which is intentionally low to prevent frame excitation in the first place), causes the balance mass-to-frame force to be imparted 'too late'. This results in the cable slab frame mounting exciting the frame, in turn exciting the 6 Hz VIS mode. This resonance may result in a dynamic relative position error between sensor and substrate due to:

the resulting servo error; and internal structural compliance between sensor and substrate causing deflection due to the acceleration of the entire MMA.

It is therefore proposed to input a feed-forward compensation force to the balance mass actuator, such that a corresponding force is imparted to the balance mass which compensates for excitement of the MMA by the cable slab. This can be done in any direction, and to any of the balance masses present in the metrology apparatus. The feed-forward compensation force may be applied to the balance mass which compensates the substrate stage carrier forces, or equally to the balance mass for compensating the sensor stage carrier forces.

In a first main embodiment, the feed-forward compensation force is determined from a mathematical model of the cable slab, using the relevant stage position as an input to obtain an estimate of the cable slab force as an output. The advantage of this method is that, assuming a good mathematical model, only the cable slab force is injected to the balance mass as the feed-forward compensation force.

In a second main embodiment, the feed-forward compensation force is determined from an estimate of the cable slab disturbance calculated as the (e.g., scaled) difference between measured stage controller output force and the stage acceleration feed-forward force. This force is presently already calculated and typically referred to as the feedback controller output. As such, the feed-forward controller output is the output of the feed-forward acceleration setpoint and the feedback controller output is the output of all unexpected forces (in this case mainly the cable slab force). This embodiment is based on the assumption that stage controller forces are dominated by cable slab hysteresis and stage mass acceleration. The advantage of this method is that the feed-forward compensation force is based on actual measurements and can be implemented sooner and with less software effort.

To further optimize the estimated cable slab force and minimize the MMA excitation, lowpass/highpass/notch-filtering can be applied. This filtering may, for example, prevent measured cable slab resonance forces being injected into the balance mass.

The above examples relate to compensation for the cable slab forces in the relevant stage's axial direction (referring to FIG. 5, the axial direction is the Y direction for the substrate stage carrier and the Z direction for the sensor stage carrier, respectively). However, in each case, the cable slab may also excite the MMA in the perpendicular direction (i.e., the Y direction for the sensor stage carrier and the Z direction for the substrate stage carrier, respectively). To reduce this MMA excitation in the perpendicular direction, a feed-forward compensation force may be injected in the balance mass of the other stage, which acts in the cable slab's perpendicular direction. In particular, the cable slab perpendicular forces induced by the sensor stage carrier act in X-direction and can hence be mitigated by a compensatory force injection to the balance mass of the substrate stage carrier which moves in the same direction. In such an embodiment, therefore, the compensatory feed-forward force applied to the substrate stage balance mass compensates for a combination of the cable slab forces in each direction. As such, the balance mass for the substrate stage carrier may have applied to it a compensatory feed-forward force which compensates for the axial cable slab force from the substrate stage carrier and the perpendicular cable slab force from the sensor stage carrier. An estimate of the required injection force can be determined by a combination of mathematical models of the disturbances together with measured signals, such as stage positions, velocities and/or accelerations.

In this manner, the balance mass actuator is provided with forces other than feedback forces, and over a broad frequency spectrum. Further advantages include a reduction in the balance mass mechanical range and increase in throughput due to faster settling.

The stage systems described herein are described in terms of stage carriers for a metrology device. However, the stage systems and concepts described are applicable to other devices where stage carriers are linked to a frame by a cable arrangement; for example the substrate stage of a lithographic patterning apparatus.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A stage system, comprising:
a stage carrier configured to hold an object;
a stage carrier positioning actuator configured to displace the stage carrier;
a balance mass configured to compensate for a displacement of the stage carrier;
a balance mass positioning actuator configured to displace the balance mass; and
a cable arrangement connected to the stage carrier and configured to supply at least power to the stage carrier,
wherein the stage system is configured to apply a compensatory feed-forward force to the balance mass which compensates for a cable arrangement force exerted by the cable arrangement,
wherein the stage system is configured to use a model of the cable arrangement to obtain an estimate of the cable arrangement force, wherein a position of the stage carrier, which is connected to the cable arrangement, is used as an input to the model of the cable arrangement, and
wherein the stage system is configured to use the estimate of the cable arrangement force to determine the compensatory feed-forward force.

2. The stage system of claim 1, wherein the stage system is configured to filter the compensatory feed-forward force before applying the compensatory feed-forward force to the balance mass, to filter out resonance forces from the cable arrangement.

3. The stage system of claim 1, wherein the cable arrangement comprises a cable slab.

4. A metrology tool configured to measure a parameter of a substrate, comprising a frame and a stage system mounted to the frame, wherein the stage system comprises:
a stage carrier configured to hold an object;
a stage carrier positioning actuator configured to displace the stage carrier;
a balance mass configured to compensate for a displacement of the stage carrier;
a balance mass positioning actuator configured to displace the balance mass; and
a cable arrangement connected between the stage carrier and the frame and configured to supply at least power to the stage carrier,
wherein the stage system is configured to apply a compensatory feed-forward force to the balance mass which compensates for a cable arrangement force exerted by the cable arrangement,
wherein the stage system is configured to use a model of the cable arrangement to obtain an estimate of the cable arrangement force, wherein a position of the stage carrier, which is connected to the cable arrangement, is used as an input to the model of the cable arrangement, and
wherein the stage system is configured to use the estimate of the cable arrangement force to determine the compensatory feed-forward force.

5. The metrology tool of claim 4, wherein the stage system is configured to filter the compensatory feed-forward force before applying the compensatory feed-forward force to the balance mass, to filter out resonance forces from the cable arrangement.

6. The metrology tool of claim 4, wherein the cable arrangement comprises a cable slab.

7. The metrology tool of claim 4, further comprising a vibration isolation system configured to isolate the metrology tool from vibrations within its environment.

8. The metrology tool of claim 4, wherein the stage system is configured such that the compensatory feed-forward force compensates for the cable arrangement force exerted on the frame by the corresponding cable arrangement.

9. The metrology tool of claim 4, wherein the stage system comprises a substrate stage system, such that the stage carrier comprises a substrate carrier configured to carry the substrate.

10. The metrology tool of claim 4, wherein the stage system comprises a sensor stage system, such that the stage carrier comprises a sensor carrier configured to carry a sensor.

11. The metrology tool of claim 4, wherein the stage system comprises:
a substrate stage system, wherein its stage carrier comprises a substrate carrier configured to carry the substrate; and
a sensor stage system, wherein its stage carrier comprises a sensor carrier configured to carry a sensor,
wherein a first balance mass of the substrate stage system receives a first compensatory feed-forward force, or
wherein a second balance mass of the sensor stage system receives a second compensatory feed-forward force.

12. The metrology tool of claim 11, wherein:
the substrate carrier is configured to be displaced by its respective stage carrier positioning actuator in a first direction;
the sensor carrier is configured to be displaced by its respective stage carrier positioning actuator in a second direction, the first direction and the second direction being mutually perpendicular; and
the first compensatory feed-forward force compensates for a sum of a first cable arrangement force exerted by a first cable arrangement of the substrate stage system in the first direction and a second cable arrangement force exerted by a second cable arrangement of the sensor stage system in the first direction.

13. The metrology tool of claim 12, wherein the substrate stage system is configured to filter the compensatory feed-forward force before applying the compensatory feed-forward force to the first balance mass.

14. The metrology tool of claim 12, wherein at least one of the first cable arrangement or the second cable arrangement comprises a cable slab.

15. The metrology tool of claim 12, further comprising a vibration isolation system configured to isolate the metrology tool from vibrations within its environment.

16. A metrology tool configured to measure a parameter of a substrate, the metrology tool comprising:
a frame;
a substrate stage system coupled to the frame, the substrate stage system comprising:
a substrate stage carrier configured to hold the substrate;
a substrate stage carrier positioning actuator configured to displace the substrate stage carrier in a first direction;
a first balance mass configured to compensate for a displacement of the substrate stage carrier;
a first balance mass positioning actuator configured to displace the first balance mass; and
a first cable arrangement connected between the substrate stage carrier and the frame; and
a sensor stage system coupled to the frame, the sensor stage system comprising:
a sensor stage carrier configured to hold a sensor;
a sensor stage carrier positioning actuator configured to displace the sensor stage carrier in a second direction, the first direction and the second direction being substantially perpendicular;
a second balance mass configured to compensate for a displacement of the sensor stage carrier;
a second balance mass positioning actuator configured to displace the second balance mass; and
a second cable arrangement connected between the sensor stage carrier and the frame,
wherein the substrate stage system is configured to apply a compensatory feed-forward force to the first balance mass, the compensatory feed-forward force compensates for a sum of a first cable arrangement force exerted by the first cable arrangement of the substrate stage system in the first direction and a second cable arrangement force exerted by the second cable arrangement of the sensor stage system in the first direction.

* * * * *